United States Patent [19]

Sakamoto

[11] Patent Number: 6,148,276
[45] Date of Patent: Nov. 14, 2000

[54] DIFFUSION SIMULATING METHOD

[75] Inventor: Hironori Sakamoto, Tokyo, Japan

[73] Assignee: NEC Corporation, Tokyo, Japan

[21] Appl. No.: 09/154,986

[22] Filed: Sep. 17, 1998

[30] Foreign Application Priority Data

Sep. 24, 1997 [JP] Japan .................................. 9-258598

[51] Int. Cl.⁷ .................................................. G06F 17/50
[52] U.S. Cl. .................................. 703/13; 703/12; 703/2
[58] Field of Search ........................ 395/500.33, 500.27, 395/500.34, 500.35, 500.23; 703/13, 14, 12, 6, 2

[56] References Cited

U.S. PATENT DOCUMENTS

| | | | |
|---|---|---|---|
| 5,502,643 | 3/1996 | Fujinaga | 716/21 |
| 5,504,016 | 4/1996 | Aronowitz | 438/5 |
| 5,784,302 | 7/1998 | Kumashiro | 703/13 |
| 5,930,494 | 7/1999 | Akiyama | 703/12 |
| 5,963,732 | 10/1999 | Syo | 703/12 |
| 6,006,026 | 12/1999 | Kumashiro | 703/13 |
| 6,011,914 | 1/2000 | Akiyama | 703/14 |
| 6,041,174 | 3/2000 | Akiyama | 703/12 |
| 6,080,200 | 6/2000 | Kumashiro | 703/13 |

OTHER PUBLICATIONS

Rorris et al., "A New Approach to the Simulation of the Coupled Point Defects and Impurity Diffusion", IEEE Trans. on Computer–Aided Design of ICs and Systems, vol. 9, Issue 10, pp. 1113–1122, Oct. 1990.

Okada et al. "Non–Equilibrium Diffusion Process Modeling Based on Three–Dimesional Simulator and a Regulated Point–Defect Injection Experiment", Tech. Digest, Intern. Electron Devices Meeting, 1990, ppl 733–736, Dec. 1990.

Taniguchi et al., "Process Modeling and Simulation: Boundary Conditions for Point Defect–Based Impurity Diffusion Model", IEEE Trans. on CAD of ICs and Systems, vol.9, Issue 11, pp. 1177–1183, Nov. 1990.

Yamamoto et al., "Boundary Condition for Grain Boundary Segregation", Proceedings of the Fifth International Conference on the Numerical Analysis of Semiconductor Devices and Integrated Circuits, pp. 340–345, Jun. 1987.

Sakumoto et al., "Simulation of Reverse Short Channel Effects with a Consistent Point–Defect Diffusion Model", Intern. Conf. on Simulation of SemiCond. Processes and Devices, pp. 137–140, Sep. 1997.

Federov et al., "Monte–Carlo Program MODEX: Simulation of Point Defect Clustering During Irradiation and Subsequent Annealing", Computational Materials Science, vol. 9, Issue 3–4, pp 309–324, Jan. 1998.

Ryo Dan, "Process Device Simulation Gijutsu (Process Device Simulation Technology)", pp. 18–29, Apr., 1990, Sangyo Tosho Publishing Co., Ltd.

C.P. Ho, J.D. Plummer, S.E. Hansen and R.W. Dutton, "VLSI Process Modeling–SUPREM III", IEEE Transactions of Eelctron Devices, vol. ED–30, No. 11, pp 1438–1453, Nov., 1983.

*Primary Examiner*—James P. Trammell
*Assistant Examiner*—Douglas W. Sergent
*Attorney, Agent, or Firm*—McGinn & Gibb, P.C.

[57] ABSTRACT

A diffusion simulating method which is capable of defining an impurity flux even if one impurity in one material region is changed into plural types of impurities in the other material region on a material interface. For simulating the diffusion of the impurities in a system which includes a first material region, a second material region and a interface disposed between the first material region and the second material region, impurity flux $J(i_A, j_B)$ on the A/B interface is defined between optional impurity $i_A$ in material region A and optional impurity $j_B$ in material region B. Then, total fluxes $J^{total}(i_A)$, $J^{total}(j_B)$ of each type of impurity are determined and added to impurity diffusion equations, and simultaneous equations are set up by these diffusion equations and solved.

9 Claims, 2 Drawing Sheets

DIFFUSION SIMULATING METHOD

BACKGROUND OF THE INVENTION

1. Field of the Invention

The present invention relates to a method of simulating a semiconductor device fabricating process or the like by a computer. More particularly, it relates to a method of simulating a diffusion of impurity when an interface is formed between a plurality of material regions.

2. Description of the Prior Arts

A process simulation means the simulation of a process of fabricating a semiconductor device. In the process simulation, without actually fabricating the semiconductor device, the semiconductor fabricating process such as an ion implantation process and a -diffusion process is analyzed by the use of a computer, whereby a physical amount and a shape such as impurity profile within the device are estimated. The process simulation is described in detail in Ryo Dan (author and editor), "*Process Device Simulation Gijutsu* (Process Device Simulation Technology)", pp. 18–29, April 1990, Sangyo Tosho Publishing Co., Ltd. A computer program for executing a process simulation is called a process simulator. Of the process simulators, the one for simulating a diffusion process is called a diffusion simulator. In general, the diffusion simulator executes the simulation of the diffusion process by numerical computation of a diffusion equation.

When a diffusion simulation is executed, more specifically, when the diffusion of the impurity is computed in a system in which two or more different material regions are in contact with one another, it is necessary to take a flux of the impurity on a material interface into consideration for the highly precise computation of an impurity concentration and also to adopt this flux into the diffusion equation. Heretofore, as described in C. P. Ho, J. D. Plummer, S. E. Hansen and R. W. Dutton, "VLSI Process Modeling-SUPREM III", IEEE Transactions on Electron Devices, Vol. ED-30, No. 11, pp. 1438–1453, November 1983, the flux of each impurity on the material interface has been defined, this flux has been adopted into the diffusion equation formulated with regard to each material region, simultaneous equations have been set up by the diffusion equation of each material region, and then the simultaneous equations have been solved.

In this method, as shown in FIG. 1, flux $J(i)$ of a certain impurity $i$ is first defined in certain coordinate points between material regions A and B, and then the value of the flux is determined. For example, the following equation is used.

$$J(i) = h(i, A/B)\left(\frac{C(i, A)}{m(i, A/B)} - C(i, B)\right) \quad (1)$$

As the above equation (1), there is a method of determining flux $J(i)$ by the use of a transport coefficient and a segregation coefficient on the interface. When the interface between material region A and material region B is assumed to be an A/B interface, $h(i,A/B)$ represents the transport coefficient of impurity $i$ on the A/B interface; $m(i,A/B)$ represents the segregation coefficient of impurity $i$ on the A/B interface; $C(i,A)$ represents the concentration of impurity $i$ on the A/B interface on the side of material region A; and $C(i,B)$ represents the concentration of impurity $i$ on the A/B interface on the side of material region B. This flux $J(i)$ is used so as to determine the fluxes of impurity $i$ on the A/B interface that should be added to the respective diffusion equations as to material regions A and B. The fluxes are determined by equations (2) and (3).

$$J(i,A)=J(i) \quad (2)$$

$$J(i,B)=-J(i) \quad (3)$$

Flux $J(i,A)$ is added to the diffusion equation as to material region A, while flux $J(i,B)$ is added to the diffusion equation as to material region B. After that, the simultaneous equations are set up by the diffusion equations to which the impurity fluxes are added, and the simultaneous equations are solved, so that the impurity concentration is obtained.

However, the above-described conventional technique taking the impurity flux on the interface between different material regions into account has a problem as described below. That is, when one impurity in material region A is changed into plural types of impurity in material region B, for example, when, in material region B, some impurity atoms enter a replacement site (lattice site) while others enter an interstitial site, the conventional method cannot deal with such a situation. The reason why this problem occurs is that the above-mentioned conventional method can define only the interfacial flux of the same type of impurity.

SUMMARY OF THE INVENTION

It is an object of the present invention to provide a diffusion simulating method which is capable of defining an impurity flux on a material interface even when one impurity in one material region is changed into a plurality of impurity components in the other material region and which has improved general-purpose properties.

The object of the present invention is achieved by a diffusion simulating method for simulating a diffusion of impurities in materials in a system which includes a first material region, a second material region and a interface disposed between said first material region and said second material region, the method comprising the steps of: defining impurity fluxes on the interface between an optional impurity in the first material region and an optional impurity in the second material region; and executing a simulation of the diffusion of the impurity in accordance with the impurity fluxes.

The diffusion simulating method of the present invention is typically carried out when a computer simulation of a semiconductor fabricating process is executed.

The more particular procedure of a diffusion simulation according to the present invention comprises the steps of, for example, defining impurity fluxes on the interface between an optional impurity in the first material region and an optional impurity in the second material region; determining a total amount of the flux of each type of impurity from the defined impurity fluxes; adding the total amount of the flux of each type of impurity to a diffusion equation of the impurity in the first material region and a diffusion equation of the impurity in. the second material region; and setting up simultaneous equations by the diffusion equations and solving the simultaneous equations.

Furthermore, an imaginary intermediate layer may be set at a position of the interface between the first and second material regions. In this case, in the first place, impurity fluxes on an interface between the first material region and the intermediate layer are defined between an optional impurity in the first material region and an optional impurity in the intermediate layer; and impurity fluxes on another interface between the second material region and the intermediate layer are defined between an optional impurity in the second material region and an optional impurity in the intermediate layer. Then, a total amount of the flux of each type of impurities is determined from the defined impurity fluxes; the total amount of the flux of each type of impurities is added to a diffusion equation of the impurity in the first material region, a diffusion equation of the impurity in the second material region and a diffusion equation of the impurity in the intermediate layer; and simultaneous equations are set up by the impurity diffusion equations and solved.

According to the present invention, the impurity flux can be defined in accordance with a transport coefficient and a segregation coefficient on the interface and an impurity concentration near the interface, for example.

The impurity described herein includes not only an impurity atom such as boron (B), phosphorus (P) and arsenic (As) in a semiconductor substrate such as a silicon (Si) substrate but also the resultant obtained by bonding these atoms to point defects, an impurity cluster or the like. The use of the method according to the present invention allows the impurity flux on the material interface to be defined even if one type of impurity in one material region is changed into a plurality of types of impurity in the other material region, and the general-purpose properties of the diffusion simulation are improved.

The above and other objects, features and advantages of the present invention will become apparent from the following description when taken in conjunction with the accompanying drawings which illustrate preferred embodiments of the present invention by way of examples.

DESCRIPTION OF THE PREFERRED EMBODIMENTS

First Embodiment

Here, a diffusion simulating method according to the present invention will be described by way of an example of the case in which diffusion of impurities in plural material regions is simulated during a computer simulation of a semiconductor fabricating process.

Figure 1:
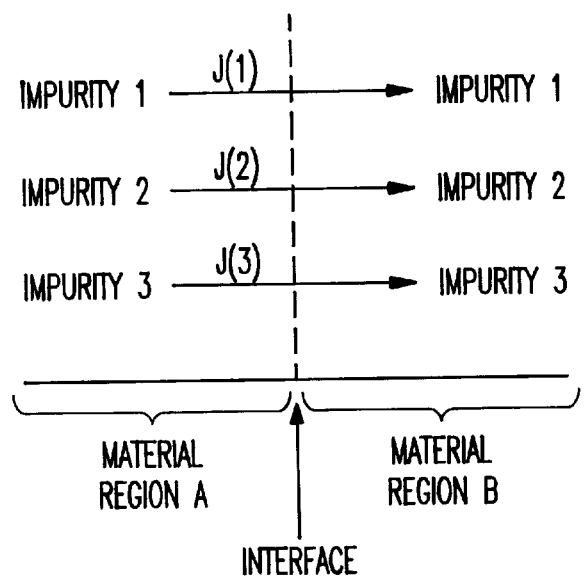
FIG. 1 is an illustration for describing a conventional diffusion simulating method.
Figure 2:
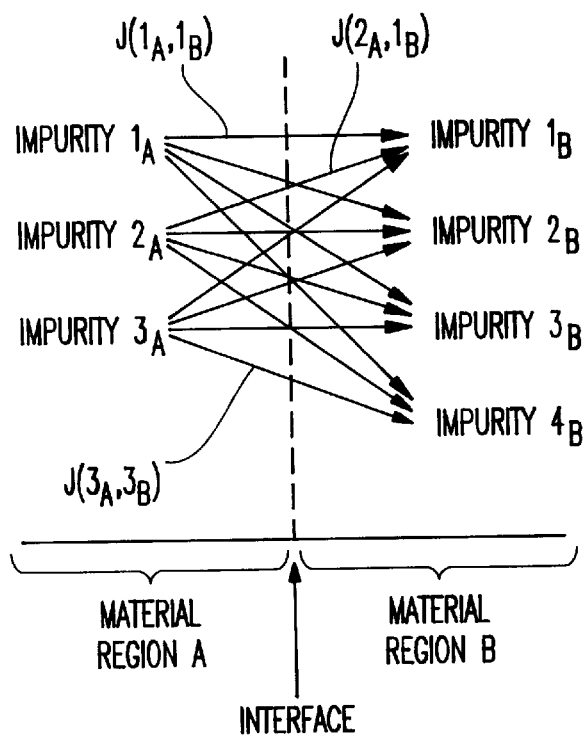
FIG. 2 is an illustration for describing the diffusion simulating method of a first embodiment of the present invention.

As shown in FIG. 2, material region A and material region B are assumed to be in contact with each other through an interface (shown by a broken line). In this drawing, it is assumed that material A contains three types of impurities (impurities $1_A$ to $3_A$) while material B contains four types of impurities (impurities $1_B$ to $4_B$).

In the first place, flux $J(i_A, j_B)$ is defined between a certain impurity $i_A$ in material A and a certain impurity $j_B$ in material B in certain coordinate points on the interface (A/B interface) between material region A and material region B, and the value of the flux is determined. Impurity flux $J(i_A, j_B)$ is determined by the use of a transport coefficient and a segregation coefficient on the interface, for example, as determined by equation (4):

$$J(i_A, j_B) = h(i_A, j_B)\left(\frac{C(i_A)}{m(i_A, j_B)} - C(j_B)\right) \quad (4)$$

where $h(i_A, j_B)$ represents the transport coefficient on the A/B interface between impurities $i_A$ and $j_B$; $M(i_A, j_B)$ represents the segregation coefficient on the A/B interface between impurities $i_A$ and $j_B$; $C(i_A)$ represents the concentration of impurity $i_A$ on the A/B interface; and $C(j_B)$ represents the concentration of impurity $j_B$ on the A/B interface. Of course, since the interface itself ideally has no volume and thus the concentration on the interface cannot be defined, the concentration on the interface means the concentration defined in a certain small area near the interface. Therefore, the concentration of impurity $i_A$ on the A/B interface is the one defined on the interface on the side of material region A, while the concentration of impurity $j_B$ on the A/B interface is the one defined on the interface on the side of material region B. In this case, for all the combinations of the impurities in material region A and the impurities in material region B, fluxes $J(i_A, j_B)$ are defined. In the shown example, since the impurities in material region A are of three types and the impurities in material region B are of four types, 3×4=12, namely, 12 types of fluxes indicated by arrows in FIG. 2 are defined.

However, since there are impossible combinations, for example, the combination in which a boron atom in material region A is changed into a phosphorus atom in material region B, the value of the flux for such impossible combinations is set to 0. In other words, the value of the impurity flux is set to 0 for the combinations physically/chemically incapable of a transition via the A/B interface.

Next, the thus determined fluxes $J(i_A, j_B)$ are used so as to determine total flux $J^{total}(i_A)$ of impurity $i_A$ on the A/B interface that should be added to the diffusion equation of material region A. Total flux $J^{total}(i_A)$ is determined by equation (5).

$$J^{total}(i_A) = \sum_{j_B} J(i_A, j_B) \quad (5)$$

The total flux $J^{total}(j_B)$ of impurity $j_B$ on the A/B interface that should be added to the diffusion equation of material region B is determined in the same manner. Total flux $J^{total}(j_B)$ is determined by equation (6).

$$J^{total}(j_B) = -\sum_{i_A} J(i_A, j_B) \quad (6)$$

After that, the simultaneous equations are set up by the diffusion equations to which the impurity fluxes are added, and the simultaneous equations are numerically solved, so that the impurity concentration is obtained. As a method of numerically solving the diffusion equations, the method by, for example, a difference method, a boundary element method (BEM) and a finite element method (FEM) can be used as well known by one skilled in the art.

According to the present embodiment, the impurity fluxes on the material interface are defined between an optional impurity in a first material region and an optional impurity in a second material region. Thus, the simulation can be executed and the general-purpose properties of the diffusion simulation are improved in even such a complicated situation that one impurity in the first material region is changed into plural types of impurities in the second material region.

Second Embodiment

Figure 3:
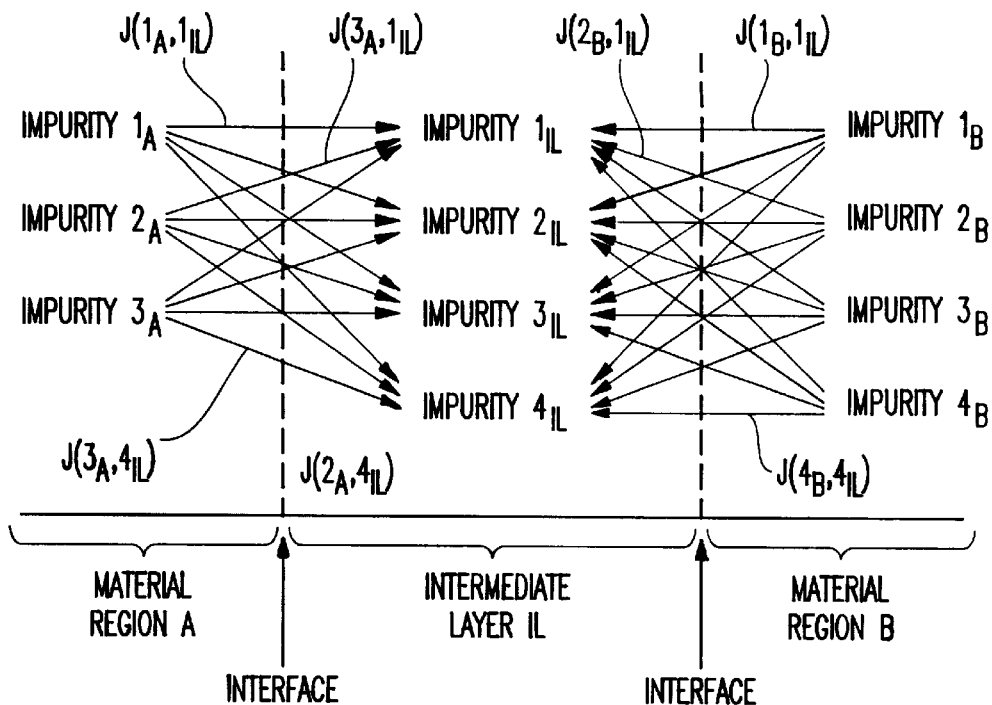
FIG. 3 is an illustration for describing the diffusion simulating method of a second embodiment of the present invention.

In a second embodiment, for the computer simulation of the semiconductor fabricating process, imaginary intermediate layer IL is set between different material regions so as to execute the diffusion simulation. Material region A and material region B are assumed to be in contact with each other through the interface, and intermediate layer IL is imaginarily set at the position of this interface as shown in FIG. 3. In this drawing, it is assumed that material region A contains three types of impurities (impurities $1_A$ to $3_A$), material region B contains four types of impurities (impurities $1_B$ to $4_B$) and intermediate layer IL also contains four types of impurities (impurities $1_{IL}$ to $4_{IL}$).

In the same manner as the first embodiment, flux $J(i_A,k_{IL})$ is defined between a certain impurity $i_A$ in material region A and a certain impurity $k_{IL}$ in intermediate layer IL on the interface between material region A and intermediate layer IL, and the value of the flux is determined. In the same way, flux $J(j_B,k_{IL})$ is determined between a certain impurity $j_B$ in material region B and a certain impurity $k_{IL}$ in intermediate layer IL on the interface between material region B and intermediate layer IL. These impurity fluxes $J(i_A,k_{IL})$, $J(j_B,k_{IL})$ are used so as to determine total flux $J^{total}(i_A)$ to be added to the diffusion equation of impurity $i_A$ on the A/B interface, total flux $J^{total}(j_B)$ to be added to the diffusion equation of impurity $j_B$ and total flux $J^{total}(k_{IL})$ to be added to the diffusion equation of impurity $k_{IL}$ in intermediate layer IL. These total fluxes are determined by equations (7)–(9).

$$J^{total}(i_A) = \sum_{k_{IL}} J(i_A, k_{IL}) \quad (7)$$

$$J^{total}(j_B) = \sum_{k_{IL}} J(j_B, k_{IL}) \quad (8)$$

$$J^{total}(k_{IL}) = -\sum_{i_A} J(i_A, k_{IL}) - \sum_{j_B} J(j_B, k_{IL}) \quad (9)$$

Then, the simultaneous equations are set up by the diffusion equations to which the impurity fluxes are added, and the simultaneous equations are solved, so that the impurity concentration is obtained.

Figure 4:
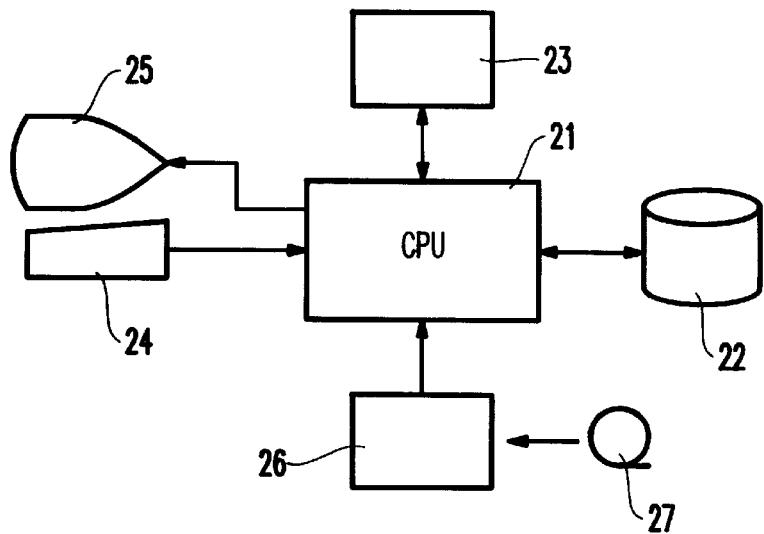
FIG. 4 is a block diagram showing a computer for executing a diffusion simulation.

The diffusion simulating method of the above-described embodiments of the present invention is executed by means of a computer such as a super computer, a workstation (WS) and a personal computer (PC) by the use of a diffusion simulator which is a computer program for executing this method. The diffusion simulator program is read in the computer by means of a recording medium such as a magnetic tape and CD-ROM (compact disc read only memory ). FIG. 4 is a block diagram showing the constitution of a computer system for executing the diffusion simulation of the above-mentioned embodiments.

This computer comprises central processing unit (CPU) 21, hard disk unit 22 for storing the program and data therein, main memory 23, input apparatus 24 such as a keyboard and a mouse, display apparatus 25 such as CRT (cathode ray tube) and medium-reading apparatus 26 for reading recording medium 27 such as the magnetic tape and CD-ROM. Hard disk unit 22, main memory 23, input apparatus 24, display apparatus 25 and medium-reading apparatus 26 are connected to CPU 21. In this computer, recording medium 27 in which the program for executing the diffusion simulation is stored is mounted to medium-reading apparatus 26, the program is read from recording medium 27 and stored in hard disk unit 22, and the program stored in hard disk unit 22 is executed by CPU 21, whereby the diffusion simulation is executed. Although the preferred embodiments of the present invention have been described in detail, it should be understood that various changes, substitutions and alternations can be made therein without departing from spirit and scope of the inventions as defined by the appended claims.

What is claimed is:

1. A diffusion simulating method for simulating diffusion of impurity in a system which includes a first material region, a second material region having at least a first impurity, and an interface disposed between said first material region and said second material region, said method comprising:

defining impurity fluxes on said interface between at least a second impurity in said first material region and at least a second impurity in said second material region, the impurity fluxes defined based on an impurity concentration in said interface;

executing a simulation of the diffusion of impurity in accordance with said impurity fluxes; and producing a design specification based on the simulation.

2. The method according to claim 1, wherein a value of said impurity flux is set to 0 for a combination physically and chemically incapable of a transition via said interface of the combinations of the impurities in said first material region and the impurities in said second material region.

3. The method according to claim 1, wherein said impurity flux is defined in accordance with a transport coefficient and a segregation coefficient of said impurity on said interface and an impurity concentration near said interface.

4. A diffusion simulating method for simulating a diffusion of impurities in a system which includes a first material region, a second material region having a first impurity, and an interface disposed between said first material region and said second material region, said method comprising:

defining impurity fluxes on said interface between at least a second impurity in said first material region and at least a second impurity in said second material region;

determining a total amount of the flux of each impurity from said defined impurity fluxes based on an impurity concentration in said interface;

adding said total amount of the flux of each impurity to a diffusion equation of the impurity in said first material region and a diffusion equation of the impurity in said second material region;

setting up simultaneous equations by said impurity diffusion equations and solving the simultaneous equations; and producing a design specification based on the solved equations.

5. The method according to claim 4, wherein said impurity flux is defined in accordance with a transport coefficient and a segregation coefficient of said impurity on said interface and the impurity concentration near said interface.

6. A diffusion simulating method for simulating a diffusion of impurities in a system which includes a first material region, a second material region, and a first interface disposed between said first material region and said second material region, said method comprising:

setting an imaginary intermediate layer at a position of said first interface;

defining impurity fluxes between an impurity in said first material region and an impurity in said intermediate layer on a second interface between said first material region and said intermediate layer based on an impurity concentration;

determining a total amount of the flux of each type of impurity from said defined impurity fluxes;

adding said total amount of the flux of each type of impurity to a diffusion equation of the impurity in said first material region, a diffusion equation of the impurity in said second material region and a diffusion equation of the impurity in said intermediate layer;

setting up simultaneous equations by said diffusion equations and solving the simultaneous equations; and producing a design specification based on the solved equations.

7. The method according to claim 6, wherein said impurity flux is defined in accordance with a transport coefficient and a segregation coefficient of said impurity on said interface and the impurity concentration near said interface.

8. A computer-readable medium in which a program for simulating a diffusion of impurities in a system which includes a first material region, a second material region, and an interface disposed between said first material and said second material region is stored, said medium storing the program for allowing a computer to execute:

defining impurity fluxes on said interface between an impurity in said first material region and an impurity in said second material region based on an impurity concentration in said interface;

determining a total amount of the flux of each impurity from said defined impurity fluxes;

adding said total amount of the flux of each impurity to a diffusion equation of the impurity in said first material region and a diffusion equation of the impurity in said second material region;

setting up simultaneous equations by said diffusion equations and solving the simultaneous equations; and displaying the solved equations for use in a design specification.

9. A computer-readable medium in which a program, for simulating a diffusion of impurities in a system which includes a first material region, a second material region, and a first interface disposed between said first material region and said second material region is stored, said medium storing the program for allowing a computer to execute:

setting an imaginary intermediate layer at a position of said first interface;

defining impurity fluxes between an impurity in said first material region and an impurity in said intermediate layer on a second interface between said first material region and said intermediate layer based on an impurity concentration;

defining impurity fluxes between an impurity in said second material region and an impurity in said intermediate layer on a third interface between said second material region and said intermediate layer based on an impurity concentration;

determining a total amount of the flux of each impurity from said defined impurity fluxes;

adding said total amount of the flux of each impurity to a diffusion equation of the impurity in said first material region, a diffusion equation of the impurity in said second material region, and a diffusion equation of the impurity in said intermediate layer;

setting up simultaneous equations by said diffusion equations and solving the simultaneous equations; and displaying the solved equations for use in a design specification.

* * * * *